US007732913B2

(12) United States Patent
Hsieh et al.

(10) Patent No.: US 7,732,913 B2
(45) Date of Patent: Jun. 8, 2010

(54) SEMICONDUCTOR PACKAGE SUBSTRATE

(75) Inventors: Tsung-Tien Hsieh, Taichung (TW);
Wen-Jung Chiang, Taichung Hsien (TW); Yu-Po Wang, Taichung Hsien (TW); Cheng-Hsu Hsiao, Taichung Hsien (TW); Sen-Yen Yang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/701,767

(22) Filed: Feb. 2, 2007

(65) Prior Publication Data

US 2007/0273026 A1    Nov. 29, 2007

(30) Foreign Application Priority Data

Feb. 3, 2006    (TW) .............................. 95103694 A

(51) Int. Cl.
*H01L 23/04* (2006.01)
(52) U.S. Cl. ..................... 257/698; 257/700; 257/737; 257/783; 257/E23.062; 326/26; 326/30

(58) Field of Classification Search ................. 257/678, 257/738; 326/26, 30
See application file for complete search history.

(56) References Cited

U.S. PATENT DOCUMENTS 6,001,671 A * 12/1999 Fjelstad ...................... 438/112
2006/0017151 A1* 1/2006 Yoon et al. .................. 257/700

* cited by examiner

*Primary Examiner*—Zandra Smith
*Assistant Examiner*—Tsz K Chiu
(74) *Attorney, Agent, or Firm*—Peter F. Corless; Steven M. Jensen; Edwards Angell Palmer & Dodge LLP

(57) ABSTRACT

A semiconductor package substrate is provided, which includes a substrate body having a plurality of conductive through holes formed therein, wherein at least two adjacent conductive through holes are formed as a differential pair, each of which has a ball pad formed at an end thereof; and at least one electrically integrated layer formed in the substrate body, and having an opening corresponding to the two adjacent conductive through holes formed as the differential pair and the ball pads thereof. Thus, the spacing between the conductive through holes and the electrically integrated layer and the spacing between the ball pads can be enlarged by the opening, so as to balance the impedance match.

12 Claims, 4 Drawing Sheets

SEMICONDUCTOR PACKAGE SUBSTRATE

FIELD OF THE INVENTION

The present invention relates to semiconductor package substrates, and more particularly, to a semiconductor package substrate for balancing impedance match.

BACKGROUND OF THE INVENTION

For a semiconductor package substrate used in an electronic device, there have typically formed a plurality of through holes, such as plated through holes (PTHs), vias and blind holes, through the substrate in order to shorten a transmission path for chip signals. Further, at least a power plane and a ground plane are provided between multiple stacked layers of the substrate to enhance the electrical performance of a semiconductor package with the substrate. Accordingly, current may flow from the power plane of the substrate to a chip mounted on the substrate and then flow to the ground plane of the substrate via the plated through holes (having metal layers plated on walls of the through holes), thereby improving the electrical quality of the chip.

When the chip signals are transmitted to an inner circuit of the substrate, inner impedance of the inner circuit is generated. In order to ensure the consistency between the inner impedance of the substrate and outer impedance of an outer circuit externally connected to the electronic device, it usually requires considering electrical functions for both signal and power distributions in the device electrical design. One common transmission circuit design relates to a structure adopting a differential pair.

The so-called "differential pair" involves an improved technique for overcoming a drawback of insufficient transmission distance and strength provided by a single signal line during parallel data transmission by bus lines. This technique allows each bit signal to be transmitted over two signal lines having inverted phases in a way of having paired complementary signals for data transmission. The use of paired complementary signals results in greater tolerance to external interference and reduction of crosstalk, echo and noise. Further, the complementary characteristic of the differential-pair signals also reduces the drifting of ground potential signals, prevents the occurrence of a ground bounce, and thereby improves the ground performance of the electronic device.

However, when the chip signals are transmitted through bonding wires, conductive circuits, the plated through holes, the ground plane (or power plane) to solder balls implanted at a bottom surface of the substrate, impedance of the chip signals is decreased due to an increase in a capacitance effect generated between the metal layers plated on the walls of the through holes and the ground/power plane. As a result, integrated circuit (IC) output impedance (i.e. external impedance) from the substrate is smaller than loop impedance (i.e. internal impedance) of the chip, thereby resulting in a return loss during signal transmission. The return loss becomes more serious when the semiconductor package is operating at a high frequency. Accordingly, the present applicant has proposed an improvement, which was filed in Taiwan and granted as Taiwan Patent No. I237381 directed to a semiconductor package substrate for maintaining impedance consistency.

As shown in FIG. 1, a semiconductor package substrate disclosed in Taiwan Patent No. I237381 comprises an opening 13 formed through electrically integrated layers 11, 12 at a position corresponding to two adjacent conductive through holes 100, 101 that are formed as a differential pair, such that the conductive through holes 100, 101 are exposed through the opening 13. When the chip signals ate transmitted from an inner circuit layer 104 through the conductive through holes 100, 101 and the electrically integrated layers 11, 12 to solder balls (not shown) implanted at a bottom surface of the substrate and output from the solder balls, the opening 13 enlarges the spacing between the conductive through holes 100, 101 and the electrically integrated layers 11, 12, such that the chip signal impedance and the IC output impedance can be maintained consistent with each other.

However, the above technology may not be suitable for a substrate in a multi-layer ball grid array (BGA) semiconductor package disclosed in U.S. Pat. No. 5,741,729. This is because such substrate is usually formed with a plurality of ball pads at a bottom surface thereof, and the ball pads are considered as a large area conductor for a signal transmission path, such that a capacitance effect is easily generated between the ball pads and an overlying power/ground plane, thereby leading to mismatch in circuit impedance and degrading the electrical performance of the semiconductor package.

Therefore, the problem to be solved here is to develop a semiconductor package substrate to overcome the above drawbacks in the prior art.

SUMMARY OF THE INVENTION

In view of the foregoing drawbacks in the prior art, an objective of the present invention is to provide a semiconductor package substrate for balancing impedance match.

Another objective of the present invention is to provide a semiconductor package substrate for reducing a capacitance effect and improving electric performance.

A further objective of the present invention is to provide a semiconductor package substrate for balancing impedance match when a semiconductor package with the substrate is operating at a high frequency, so as to allow adjacent conductive through holes to function as a differential pair to maintain consistency between loop impedance of a chip mounted on the substrate and IC output impedance.

In order to achieve the above-mentioned and other objectives, the present invention proposes a semiconductor package substrate comprising: a substrate body formed with a plurality of conductive through holes, wherein at least two adjacent ones of the conductive through holes are formed as a differential pair, and each of the at least two conductive through holes has a ball pad formed at an end thereof; and at least one electrically integrated layer formed in the substrate body and having an opening corresponding to the at least two conductive through holes and the ball pads of the conductive through holes.

In the above semiconductor package substrate, the electrically integrated layer is a ground plane or a power plane. Alternatively, the semiconductor package substrate may include two electrically integrated layers, which are a ground plane and a power plane respectively and are spaced apart and electrically isolated from each other by an insulating core layer. Preferably, the insulating core layer is made of epoxy resin, polyimide, cyanate ester, glass fiber, bismaleimide triazine (BT), or FR5 resin that is a mixture of epoxy resin and glass fiber.

According to one embodiment, the semiconductor package substrate includes two electrically integrated layers spaced apart from each other, which are a ground plane and a power plane respectively, wherein the opening corresponding to the ball pads only penetrates one of the electrically integrated layers (usually the power plane) which is relatively closer to the ball pads. The opening is sized large enough to cover the conductive through holes formed as the differential pair and the ball pads thereof. The opening can have a shape of ellipse, cross, circle or rectangle.

Therefore, the semiconductor package substrate of the present invention solves the impedance mismatch problem caused by the capacitance effect between the ball pads of the conductive through holes and the ground and power planes for a signal transmission path of a multi-layer package substrate. Further, the semiconductor package substrate of the present invention is formed with an opening in the electrically integrated layers corresponding to the conductive through holes formed as the differential pair and the ball pads thereof, so as to enlarge the spacing between the conductive through holes and the electrically integrated layers and the spacing between the ball pads, as required for the semiconductor package operating at a high frequency. As the capacitance of a capacitor is inversely proportional to the spacing between two metal plates of the capacitor, and is also inversely proportional to the impedance of the capacitor, the capacitance effect generated by the ball pads of the conductive through holes can be reduced when the spacing between the conductive through holes and the electrically integrated layers and the spacing between the ball pads are enlarged. This thereby improves the impedance match for the semiconductor package operating at a high frequency, and maintain consistency between chip loop impedance (i.e. internal impedance) and IC output impedance (i.e. external impedance) to achieve balanced impedance match provided by the differential pair of the conductive through holes, so as to allow the semiconductor package substrate to be applicable to various BGA semiconductor packages.

Moreover, the provision of the opening advantageously allows the impedance to be adjusted by designing the space between the ball pads and the electrically integrated layers, so as to improve the electrical performance. The insulating core layer can further be used to separate the conductive through holes or separate the electrically integrated layers and the ball pads, so as to control the capacitance effectively and thereby control the impedance.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Preferred embodiments of a semiconductor package substrate proposed in the present invention are described as follows with reference to FIGS. 2 to 4. It should be understood that the drawings are simplified schematic diagrams only showing the elements relevant to the present invention, and the layout of elements could be more complicated in practical implementation.

First Embodiment

Figure 1:
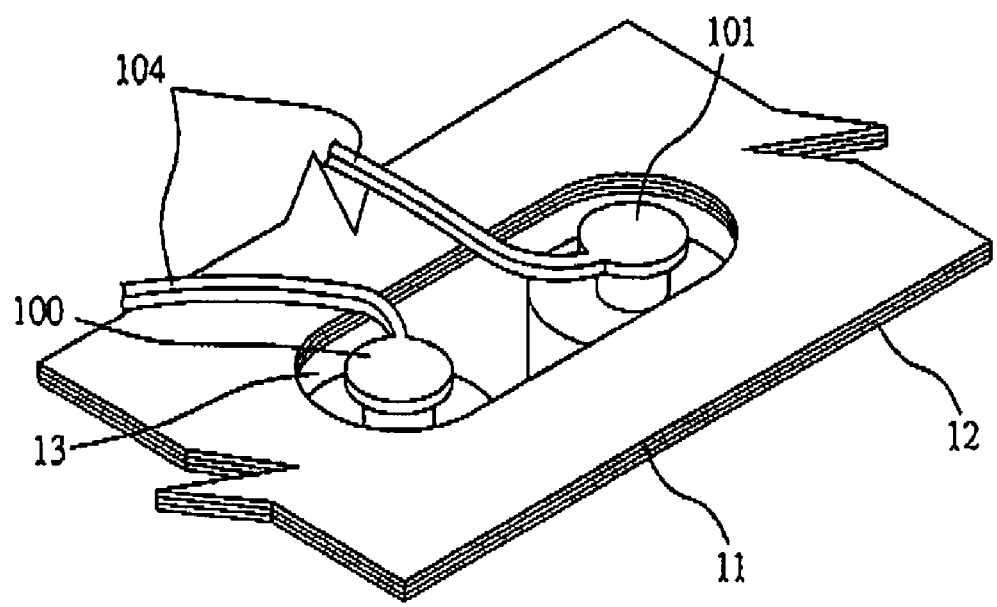
FIG. 1 (PRIOR ART) is a schematic diagram of a semiconductor package substrate disclosed in Taiwan Patent No. I237381 with an insulating core layer and a circuit layer being removed.
Figure 2:
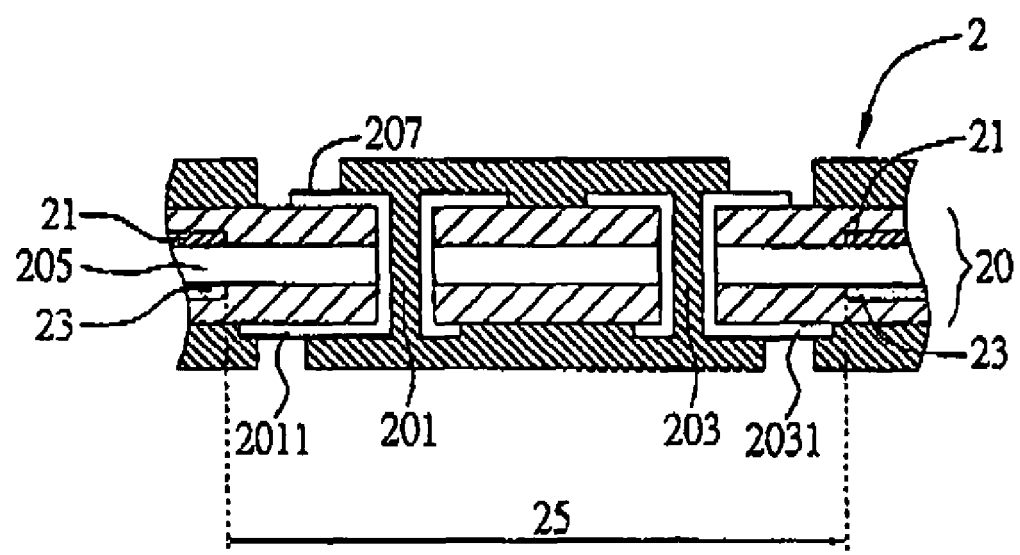
FIG. 2 is a cross-sectional view of a semiconductor package substrate according to a first embodiment of the present invention.

As shown in FIG. 2, a semiconductor package substrate 2 according to a first embodiment of the present invention comprises a substrate body 20 formed with a plurality of conductive through holes 201, 203 therein, wherein at least two adjacent conductive through holes 201, 203 are formed as a differential pair, each of which has a ball pad 2011, 2031 formed at an end thereof; and electrically integrated layers 21, 23 formed in the substrate body 20 and having an opening 25 corresponding to the conductive through holes 201, 203 formed as the differential pair and the ball pads 2011, 2031 thereof, wherein the opening 25 is sized larger enough to cover the conductive through holes 201, 203 formed as the differential pair and the ball pads 2011, 2031 thereof.

The substrate body 20 is a multi-layer printed circuit board (PCB) for use in a BGA semiconductor package. The substrate body 20 comprises at least one insulating core layer 205, and an inner circuit layer 207 formed on each of a top surface and a bottom surface of the insulating core layer 205. The insulating core layer 205 can be made of epoxy resin, polyimide, cyanate ester, glass fiber, bismaleimide triazine (BT), FR5 resin (a mixture of epoxy resin and glass fiber), or resin coated copper (RCC).

In order to provide electrical connection between the multiple layers of the substrate body 20, during the fabrication processes, the plurality of conductive through holes 201, 203, such as plated through holes, vias, blind holes or any other types of through holes, are formed in the substrate body 20 by laser drilling, plasma etching or mechanical drilling, so as to allow chip signals to be transmitted between overlying and underlying circuit layers of the substrate body 20.

The electrically integrated layers 21, 23, such as a ground plane (usually a Vss layer) and a power plane (usually a $V_{DD}$ layer) respectively, are formed on the top and bottom surfaces of the insulating core layer 205 respectively, making the electrically integrated layers 21, 23 separated by the insulating core layer 205. Then, a dielectric layer or RCC is pressed onto each of the electrically integrated layers 21, 23 and is patterned to form the inner circuit layer 207.

Figure 3:
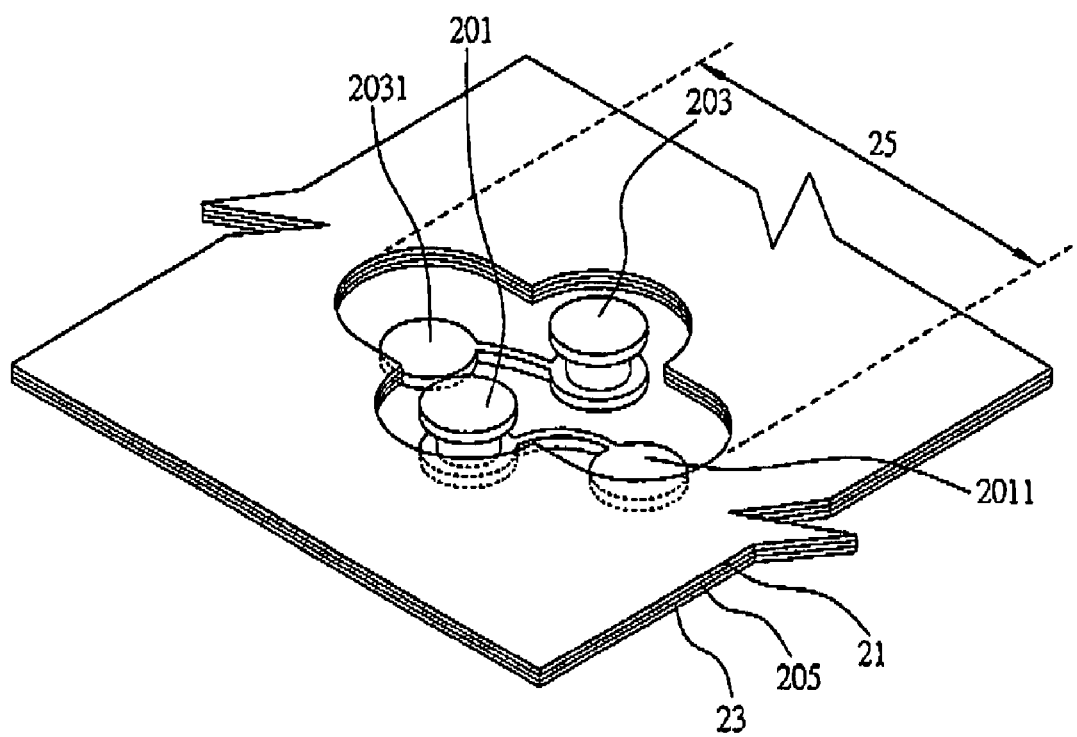
FIG. 3 is a schematic diagram of the semiconductor package substrate shown in FIG. 2 after an insulating core layer and a circuit layer are removed.

If the dielectric layer and the inner circuit layer 207 of the substrate body 20 are not considered, but only the electrically integrated layers 21, 23, the conductive through holes 201, 203 and the ball pads 2011, 2031 are concerned, as shown in FIG. 3, the semiconductor package substrate 2 is importantly formed with the opening 25 in the electrical integrated layers 21, 23 and corresponding to the conductive through holes 201, 203 formed as the differential pair and the ball pads 2011, 2031 thereof. The opening 25 is sized large enough to cover the conductive through holes 201, 203 formed as the differential pair and the ball pads 2011, 2031 thereof. The opening 25 may have a shape of cross, ellipse, rectangle, or circle, etc. as long as the shape of the opening 25 does not affect the penetration of the conductive through holes 201, 203 and other electrical factors.

The differential pair involves an improved technique for overcoming a drawback of insufficient transmission distance and strength provided by a single signal line during parallel data transmission by bus lines. This technique allows each bit signal to be transmitted over two signal lines having inverted phases in a way of having paired complementary signals for data transmission. The use of paired complementary signals results in greater tolerance to external interference and reduction of crosstalk, echo and noise. Further, the complementary characteristic of the differential-pair signals also reduces the drifting of ground potential signals, prevents the occurrence of a ground bounce, and thereby improves the ground performance of the electronic device.

Therefore, the semiconductor package substrate 2 in the first embodiment solves the impedance mismatch problem caused by the capacitance effect between the ball pads 2011, 2031 of the conductive through holes 201, 203 and the electrically integrated layers 21, 23 (such as the ground and power planes) for a signal transmission path of a multi-layer package substrate. Further, the semiconductor package substrate 2 is formed with an opening 25 in the electrically integrated layers 21, 23 corresponding to the conductive through holes 201, 203 formed as the differential pair and the ball pads 2011, 2031 thereof, so as to enlarge the spacing between the conductive through holes 201, 203 and the electrically integrated layers 21, 23 and the spacing between the ball pads 2011, 2031, as required for the semiconductor package operating at a high frequency, thereby maintaining the consistency between chip signal impedance and IC output impedance.

Since the capacitance of a capacitor is inversely proportional to the spacing between two metal plates of the capacitor and is also inversely proportional to the impedance of the capacitor, the provision of the opening 25 allows the spacing between the conductive through holes 201, 203 and the electrically integrated layers 21, 23 (such as the ground and power planes) and the spacing between the electrically integrated layers 21, 23 and the ball pads 2011, 2031 to be enlarged, such that capacitance effects between the conductive through holes 201, 203 and between the ball pads 2011 and 2013 are reduced. This thereby prevents reduction of the chip signal impedance after the chip signals travel through the electrically integrated layers 21, 23 (such as the ground and power planes) to solder balls (not shown), and improves the impedance match for the semiconductor package operating at a high frequency, such that consistency between the chip loop impedance (i.e. internal impedance) and IC output impedance (i.e. external impedance) can be maintained.

Moreover, the insulating core layer 205 located between the electrically integrated layers 21, 23 can separate the conductive through holes 201, 203, and the capacitance effects can be controlled effectively through adjustment of the spacing between the ball pads 2011, 2031 and the electrically integrated layers 21, 23, so as to improve the electrical performance of the differential pair of the conductive through holes 201, 203. Therefore, when the chip signals are transmitted and outputted from the inner circuit layer 207, through the conductive through holes 201, 203 and the electrically integrated layers 21, 23, to the ball pads 2011, 2031 formed at a bottom surface of the semiconductor package substrate 2, the complementary characteristic of the differential pair facilitates reduction of crosstalk, echo, noise, and return loss during signal transmission, thereby making the signals paired and concentrated as required for a high speed transmission path of a high frequency product.

In the first embodiment, the opening 25 is formed through the two electrically integrated layers 21, 23 (such as the ground and power planes) of the substrate body 20 and corresponding to the two adjacent conductive through holes 201, 203 formed as the differential pair and the ball pads 2011, 2031 thereof. It should be noted that, in other embodiments, the opening 25 is not limited to one penetrating the two electrically integrated layers 21, 23.

Second Embodiment

Figure 4:
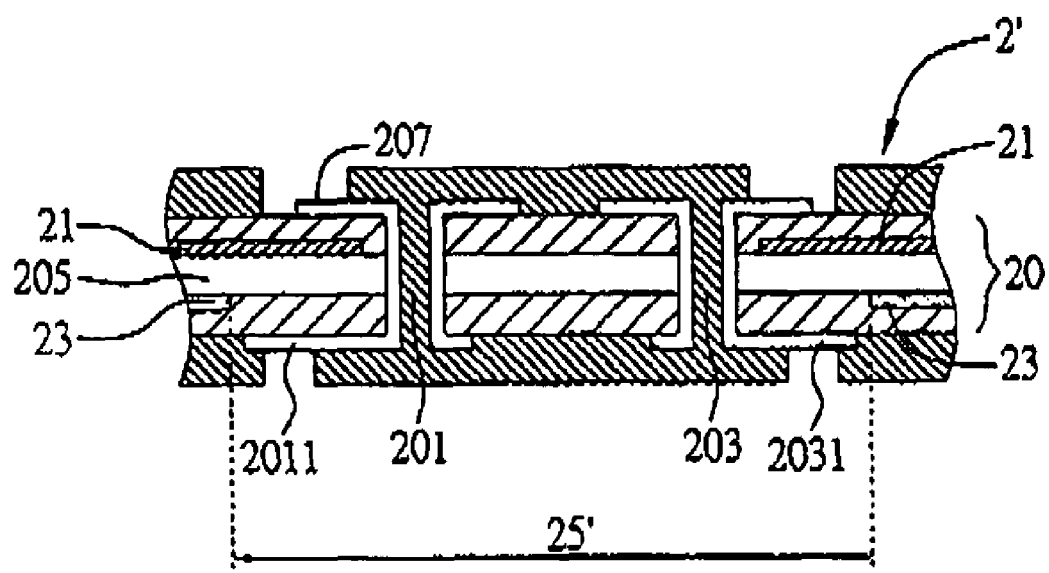
FIG. 4 is a cross-sectional view of a semiconductor package substrate according to a second embodiment of the present invention.

FIG. 4 is a cross-sectional view of a semiconductor package substrate 2' according to a second embodiment of the present invention, wherein same or similar components are represented by same or similar reference numerals as compared with the first embodiment and detailed descriptions thereof may be omitted to allow the present invention to be more easily understood. The second embodiment primarily differs from the first embodiment in that, the opening penetrates only one of the electrically integrated layers, such as a power plane, which is relatively closer to the ball pads.

As shown in FIG. 4, the semiconductor package substrate 2' comprises a substrate body 20 formed with a plurality of conductive through holes 201, 203 therein, wherein at least two adjacent conductive through holes 201, 203 are formed as a differential pair, each of which has a ball pad 2011, 2031 formed at an end thereof; electrically integrated layers 21, 23, such as a ground plane and a power plane respectively, formed in the substrate body 20; and an opening 25' corresponding to the conductive through holes 201, 203 formed as a differential pair and the ball pads 2011, 2031, wherein the opening 25' does not penetrate the electrically integrated layer 21 (such as the ground plane) but merely penetrates the electrically integrated layer 23 (such as the power plane) that is closer to the ball pads 2011, 2031.

In this embodiment, although the opening 25' only penetrates the electrically integrated layer 23 (such as the power plane) that is closer to the ball pads 2011, 2031, the capacitance effect can still be controlled effectively through adjustment of the spacing between the ball pads 2011, 2031 and the electrically integrated layer 23, and the electrical performance of the differential pair of the conductive through holes 201, 203 may also be improved. Particularly, the larger the area of a dog-bone region formed by the conductive through hole 201 and the ball pad 2011, the better the electrical performance improved by the provision of the opening 25' would be.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package substrate comprising:
   a substrate body formed with a plurality of conductive through holes therein and a plurality of ball pads electrically connected to the conductive through holes, wherein at least two adjacent ones of the conductive through holes are formed as a differential pair; and
   at least one electrically integrated layer formed in the substrate body, and having an opening corresponding to the at least two conductive through holes and the ball pads, wherein the opening is sized large enough to completely cover the at least two conductive through holes and all of the ball pads, such that capacitance effects are controlled through adjustment of a spacing between the ball pads and the electrically integrated layer so as to maintain consistency between chip loop impedance and IC output impedance.

2. The semiconductor package substrate of claim 1, wherein the electrically integrated layer is a ground plane.

3. The semiconductor package substrate of claim 1, wherein the electrically integrated layer is a power plane.

4. The semiconductor package substrate of claim 1, comprising two electrically integrated layers, which are a ground plane and a power plane respectively.

5. The semiconductor package substrate of claim 4, further comprising an insulating core layer formed between the ground plane and power plane, for electrically isolating the ground plane and the power plane from each other.

6. The semiconductor package substrate of claim 5, wherein the insulating core layer is made of one of epoxy resin, polyimide, cyanate ester, glass fiber, bismaleimide triazine (BT), and FR5 resin that is a mixture of epoxy resin and glass fiber.

7. The semiconductor package substrate of claim 1, comprising two electrically integrated layers, which are a ground plane and a power plane respectively, wherein the opening corresponding to the ball pads is formed in one of the electrically integrated layers relatively closer to the ball pads.

8. The semiconductor package substrate of claim 7, wherein the one of the electrically integrated layers relatively closer to the ball pads is a power plane.

9. The semiconductor package substrate of claim 1, wherein the opening has a shape of ellipse.

10. The semiconductor package substrate of claim 1, wherein the opening has a shape of cross.

11. The semiconductor package substrate of claim 1, wherein the opening has a shape of circle.

12. The semiconductor package substrate of claim 1, wherein the opening has a shape of rectangle.

* * * * *